(12) United States Patent
Jung et al.

(10) Patent No.: US 7,803,656 B2
(45) Date of Patent: Sep. 28, 2010

(54) METHOD OF DEPOSITING CHALCOGENIDE FILM FOR PHASE-CHANGE MEMORY

(75) Inventors: Yu-Min Jung, Daejeon (KR); Ki-Hoon Lee, Kyungki-do (KR)

(73) Assignee: IPS Ltd., Kyungki-do (KR)

( * ) Notice: Subject to any disclaimer, the term of this patent is extended or adjusted under 35 U.S.C. 154(b) by 2 days.

(21) Appl. No.: 12/301,071

(22) PCT Filed: May 18, 2007

(86) PCT No.: PCT/KR2007/002425

§ 371 (c)(1),
(2), (4) Date: Nov. 17, 2008

(87) PCT Pub. No.: WO2008/002017

PCT Pub. Date: Jan. 3, 2008

(65) Prior Publication Data

US 2009/0093083 A1    Apr. 9, 2009

(30) Foreign Application Priority Data

Jun. 29, 2006    (KR) .................. 10-2006-0059097

(51) Int. Cl.
*H01L 21/06* (2006.01)
(52) U.S. Cl. .......................... 438/102; 438/95; 438/513

(58) Field of Classification Search ............ 438/95, 438/102, 513
See application file for complete search history.

(56) References Cited

U.S. PATENT DOCUMENTS

| 5,825,046 | A | 10/1998 | Czubatyj et al. |
| 6,709,958 | B2 * | 3/2004 | Li et al. ............... 438/513 |
| 7,192,854 | B2 * | 3/2007 | Sasaki et al. ........... 438/513 |
| 7,622,400 | B1 * | 11/2009 | Fox et al. ............. 438/784 |
| 2003/0186504 | A1 | 10/2003 | Li et al. |

OTHER PUBLICATIONS

International Search Report; mailed Aug. 20, 2007; PCT/KR2007/002425.

* cited by examiner

*Primary Examiner*—Phuc T Dang
(74) *Attorney, Agent, or Firm*—Ladas & Parry LLP

(57) ABSTRACT

Provided is a method of depositing a chalcogenide film for phase-change memory. When the chalcogenide film for phase-change memory is deposited through a method using plasma such as plasma enhanced chemical vapor deposition (PECVD) or plasma enhanced atomic layer deposition (PEALD), a plasma reaction gas including He is used such that the crystallinity of the chalcogenide film is adjusted and the grain size and morphology of the deposited film are adjusted.

6 Claims, 6 Drawing Sheets

Reset        Set

METHOD OF DEPOSITING CHALCOGENIDE FILM FOR PHASE-CHANGE MEMORY

CROSS-REFERENCE TO RELATED PATENT APPLICATION

Under, 35 U.S.C. 371, the present application claims the benefit of priority under to International Patent Application No. PCT/KR07/02425 filed on 18 May 2007, the contents of which are incorporated herein by reference in their entirety.

TECHNICAL FIELD

The present invention relates to a phase-change memory, and more particularly, to a method of depositing a chalcogenide film which is a phase-change film for phase-change memory.

BACKGROUND ART

Phase-change memory is a device which uses a phase-change film formed of a chalcogenide material of which electrical resistance is changed according to a crystal state such as an amorphous or crystalline state in a memory cell. Due to a non-volatile property, a fast read/write speed, low power consumption, high reliability and durability, and integration of a device, phase-change memory has been spotlighted. In such phase-change memory, Joule's heat caused by current has been used as a heat source for phase change. FIG. 1 illustrates the structure of a conventional phase-change memory cell array.

As illustrated in FIG. 1, a memory cell has a structure in which one cell transistor CTR of which gate is connected to a word line WL and a phase-change cell PCC and a resistor R between a drain and a bit line BL of the cell transistor CTR are connected in series. When the word line WL and the bit line BL are selected, current is applied to the selected phase-change cell PCC and the crystal state of the PCC is changed.

FIG. 2 illustrates the principle of the phase-change memory. As illustrated in FIG. 2, after a high pulse current of approximately 2 mA is applied to a phase-change film 20 for about 50 ns via a contact 10 from a transistor disposed below the phase-change film 20 and is heated to a melting point $T_m$, a programming region 30 having a high resistance in a full amorphous state is formed in a portion in which the phase-change film 20 and the contact 10 contact each other using a fast cooling speed when the pulse current is intercepted. This state is referred to as a reset state, and the reset state is defined as a state in which, for example, data '1' is stored.

In this state, a pulse current of approximately 0.1 mA is applied to the phase-change film 20 via the contact 10 from the transistor disposed below the phase-change film 20 and the phase-change film 20 is kept at a crystallization temperature and then, the temperature of the phase-change film 20 is lowered. As such, the programming region 30 in the reset state is recovered to a crystalline state having a low resistance and this state is referred to as a set state, and the set state is defined as a state in which, for example, data '0' is stored. When stored data is read, a lower current than a reset current and a set current is applied to the phase-change film 20 and a change in a resistance is checked.

DISCLOSURE OF INVENTION

Technical Problem

A chalcogenide compound used as a phase-change film is generally deposited through plasma enhanced chemical vapor deposition (PECVD), plasma enhanced atomic layer deposition (PEALD), radical assisted CVD (RACVD) or radical assisted ALD (RAALD) using plasma. Due to characteristics of PECVD, PEALD, RACVD or RAALD, composition adjustment is easily performed. However, a chalcogenide film is deposited to have a columnar structure in which crystallinity is excessively clear, and the uniformity of the chalcogenide film is not good.

Currently, since a device has been highly integrated, even in a phase-change memory, the size of a memory cell is reduced and power which can be allocated to the memory cell is reduced accordingly. Thus, it is very important to drive the phase-change memory with low power.

In addition, when the grain size of the phase-change film is excessively large or surface roughness thereof is not good, a change in the volume of a chalcogenide film due to phase change is large and the characteristic of the memory device may be degraded.

In this way, as the device is highly integrated, the crystallinity and grain size of the phase-change film become important. However, there is a limitation in a current deposition method.

Technical Solution

The present invention provides a method of depositing a chalcogenide film by which the crystallinity of a phase-change film is adjusted and the grain size of the phase-change film is adjusted so that excellent morphology can be obtained.

According to an aspect of the present invention, there is provided a method of depositing a chalcogenide film for phase-change memory using plasma. According to the method, the chalcogenide film may be deposited using a reaction gas including He as a plasma reaction gas. The chalcogenide film deposited by the present invention is locally or totally amorphous state.

A frequency bandwidth of the plasma may be 300 KHz to 27.12 MHz. The chalcogenide film may comprise at least one selected from the group consisting of GaSb, InSb, InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe) or $Te_{81}Ge_{15}Sb_2S_2$ and a combination thereof.

A frequency bandwidth of the plasma may be 2 MHz to 27.12 MHz, and the amount of He may be adjusted such that the concentration of impurity included in the chalcogenide film is adjusted by 1-10%. The impurity may comprise a solid solution element that exist in a source and a reaction gas which are materials for a deposited film, for example, C, N, P, B, and a combination thereof. The proper amount of He depends on a frequency region and may be 50-1000 sccm.

Specific matters of other embodiments are included in the detailed description of the invention and the drawings.

ADVANTAGEOUS EFFECTS

According to the present invention, when the phase-change film is deposited through a method using plasma such as PECVD, PEALD, RACVD or RAALD, the reaction gas including He is used. He has a low breakdown voltage and allows plasma to be made uniform and stable. By using He, comparatively many nuclear creation sites are made at an initial stage of deposition and a grain size can be reduced. By suppressing excessive crystal growth, the crystallinity of the phase-change film can be adjusted, the deposited film can be made to have an amorphous state and the present invention is advantageous to low power. In addition, a chalcogenide film can be densely formed and a film having good surface roughness and uniformity can be formed.

BEST MODE

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
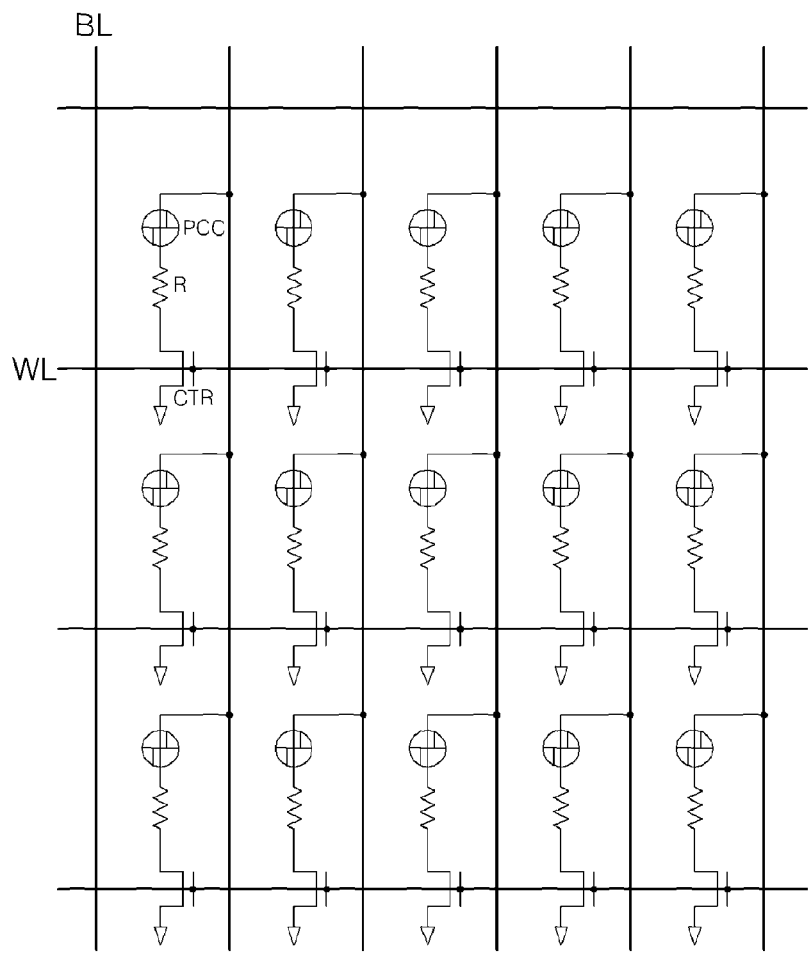
FIG. 1 illustrates the structure of a cell array of conventional phase-change memory.
Figure 2:
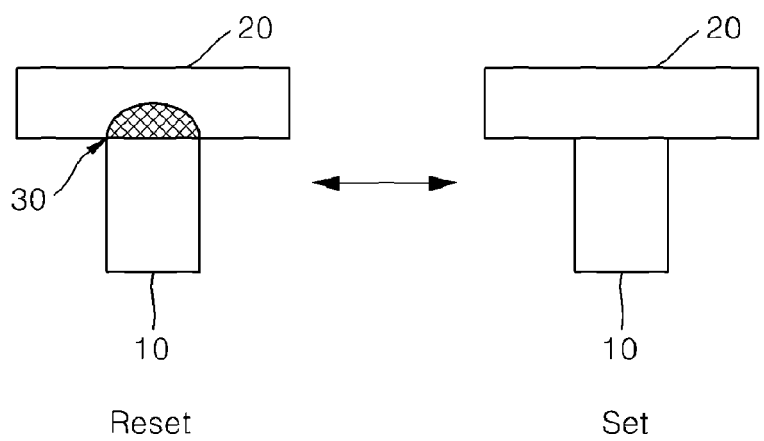
FIG. 2 illustrates the reset/set principle of the phase-change memory illustrated in FIG. 1.
Figure 3:
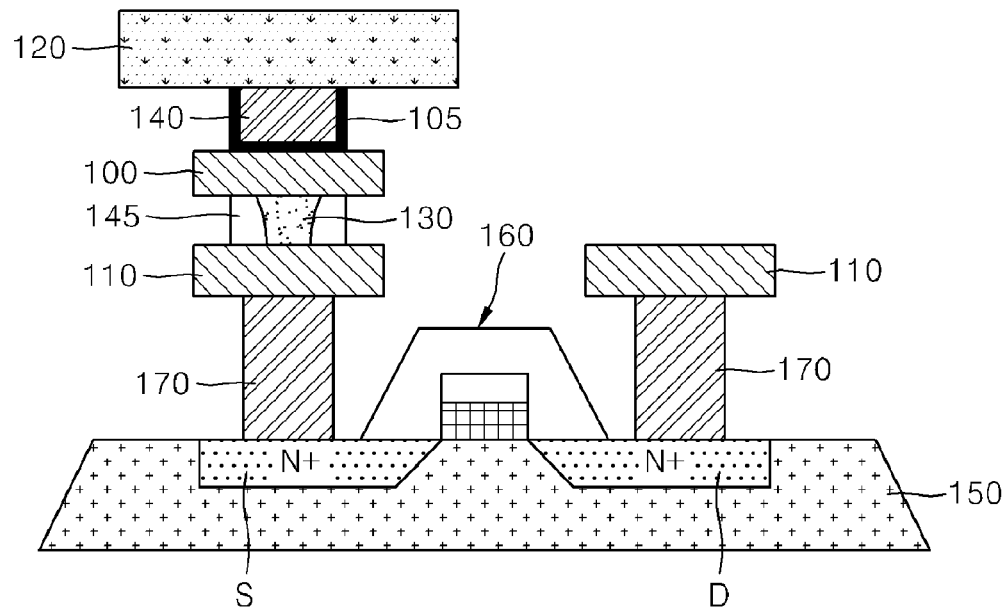
FIG. 3 is a schematic cross-sectional view of phase-change memory that can be implemented using a method of depositing a chalcogenide film according to an embodiment of the present invention.

FIG. 3 is a schematic cross-sectional view of phase-change memory that can be implemented using a method of depositing a chalcogenide film according to an embodiment of the present invention.

Referring to FIG. 3, a phase-change film 100 is disposed between first metallization 110 and second metallization 120 which are connected to each other through a source S and a conductive plug 170 of an MOS transistor formed on a substrate 150. The phase-change film 100 is connected to the first metallization 110 and the second metallization 120 through a lower electrode contact 130 and an upper electrode contact 140, respectively. As an example of a material that can be used in forming the phase-change film 100, a binary compound is GaSb, InSb, InSe, $Sb_2Te_3$ or GeTe, and a ternary compound is $Ge_2Sb_2Te_5$, InSbTe, GaSeTe, $SnSb_2Te_4$ or InSbGe, and a quaternary compound is AgInSbTe, (GeSn)SbTe, GeSb(SeTe) or $Te_{81}Ge_{15}Sb_2S_2$.

A spacer 145 is formed so as to reduce a contact area with the phase-change film 100, and the lower electrode contact 130 is formed of a Ti/TiN plug. The Ti/TiN plug is formed by depositing Ti/TiN in a lower electrode contact hole using CVD and by planarizing deposited Ti/TiN using chemical mechanical polishing (CMP). The contact area can be made to around 40-70 nm by adjusting the size of the spacer 145. A Ti/TiN film 105 is formed on the phase-change film 100 so as to improve an adhesion property with the upper electrode contact 140. The upper electrode contact 140 is formed of a tungsten (W) plug. The W plug is formed by depositing W in an upper electrode contact hole using CVD and by planarizing deposited W using CMP. A drain line formed of the first metallization 110 through a drain D of an MOS transistor 160 and a conductive plug 170 is also formed. The MOS transistor 160 may be implemented using a 0.24□ complementary metal-oxide semiconductor (CMOS) process. By forming a gate insulating layer having a thickness of around 35 Å, for example, the MOS transistor 160 may transmit a current of more than 2 mA at a 3 V gate voltage. In order to reduce a serial resistance component of a source S and the drain D of the MOS transistor 160 and the contact plug 170, a Co salicide process may also be added to the source S/drain D.

The current flows through the upper electrode contact 140 from the lower electrode contact 130 through the phase-change film 100. Due to heating using Joule's heat and cooling by current interception, phase change occurs at an interface between the phase-change film 100 and the lower electrode contact 130.

Figure 4A:
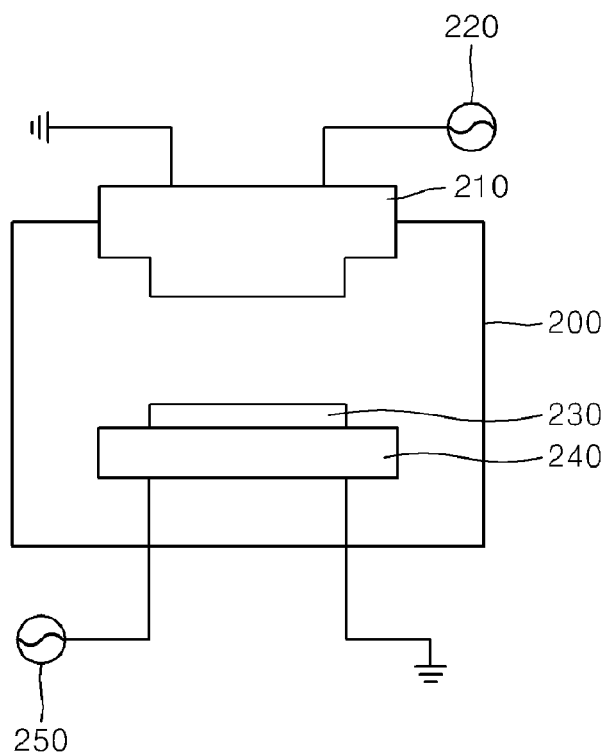
FIGS. 4A and 4B are diagrams of equipment for performing a method of depositing a phase-change film according to an embodiment of the present invention.
Figure 4B:
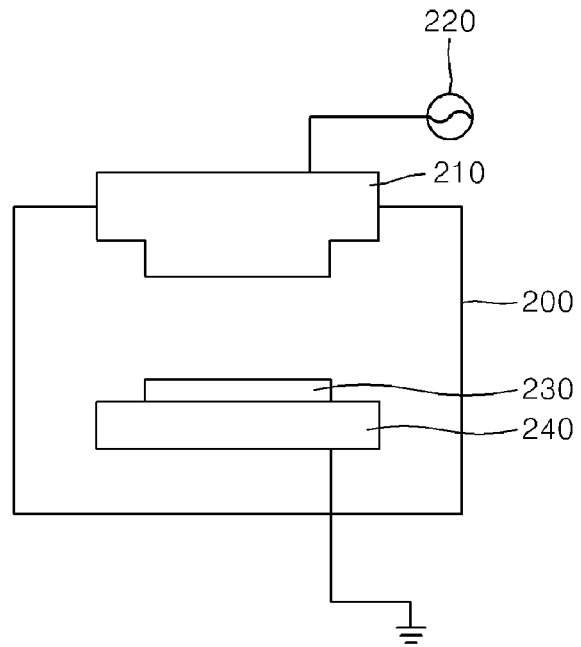

FIGS. 4A and 4B are diagrams of equipment for performing a method of depositing the phase-change film 100 according to an embodiment of the present invention.

First, referring to FIG. 4A, a first AC voltage 220 is applied to one side of a shower head 210 of a chamber 200 for depositing a chalcogenide film which is the phase-change film 100, and the other side of the shower head 210 is grounded. A second AC voltage 250 is applied to one side of a support 240 for supporting a substrate 230 on which the chalcogenide film is deposited, and the other side of the support 240 is grounded. In this case, a ground portion of the shower head 210 and a voltage-applied portion of the support 240 and a voltage-applied portion of the shower head 210 and a ground portion of the support 240, respectively, may face each other. The support 240 may be referred to as a susceptor or a stage heater according to types of equipment.

After the substrate 230 is loaded into equipment, a frequency bandwidth of at least one of the first AC voltage 220 and the second AC voltage 250 is 300 KHz to 27.12 MHz and plasma is generated in the chamber 200, and the chalcogenide film is deposited on the substrate 230 through a method such as plasma enhanced chemical vapor deposition (PECVD), plasma enhanced atomic layer deposition (PEALD), radical assisted CVD (RACVD) or radical assisted ALD (RAALD) using plasma. At this time, a reaction gas including He is used as a plasma reaction gas. For example, a mixed gas of He and Ar is used.

The equipment of FIG. 4B is similar to the equipment of FIG. 4A. However, there is only a difference in that the first AC voltage 220 is applied only to the shower head 210 and the support 240 is grounded. After the substrate 230 is loaded into the equipment, a frequency bandwidth of the first AC voltage 220 is 300 KHz to 27.12 MHz and plasma is generated in the chamber 200, and the chalcogenide film is deposited on the substrate 230 through a method such as PECVD, PEALD, RACVD or RAALD using plasma.

The chalcogenide film deposited using the above-described equipment may comprise at least one selected from the group consisting of GaSb, InSb, InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe) or $Te_{81}Ge_{15}Sb_2S_2$ and a combination thereof. Any deformation film based on these films may be deposited.

Figure 5A:
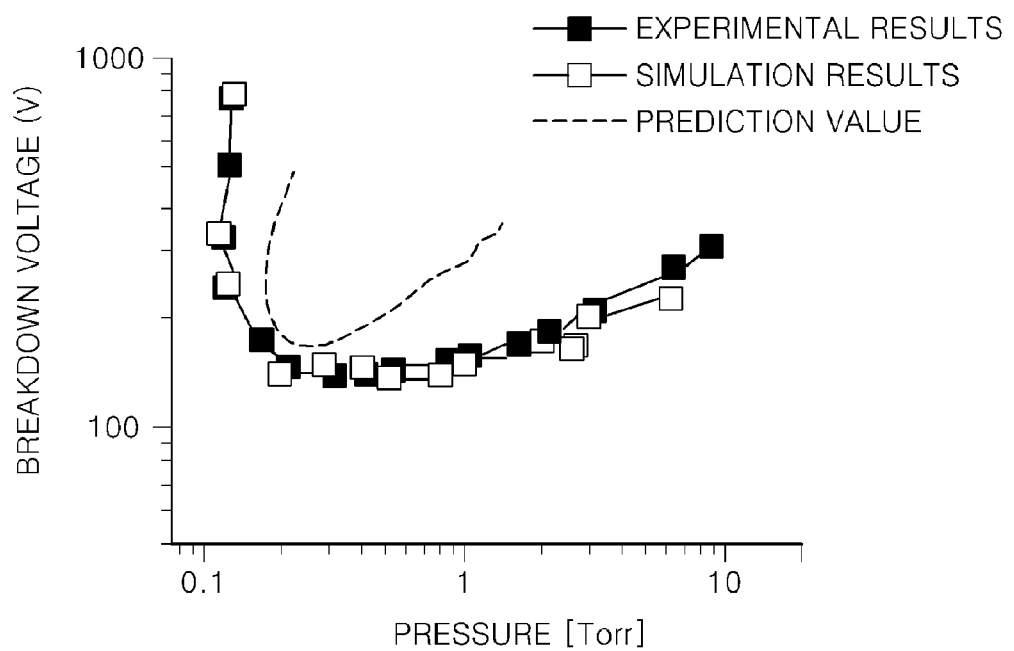
FIG. 5A is a graph showing a breakdown voltage of Ar according to pressure.
Figure 5B:
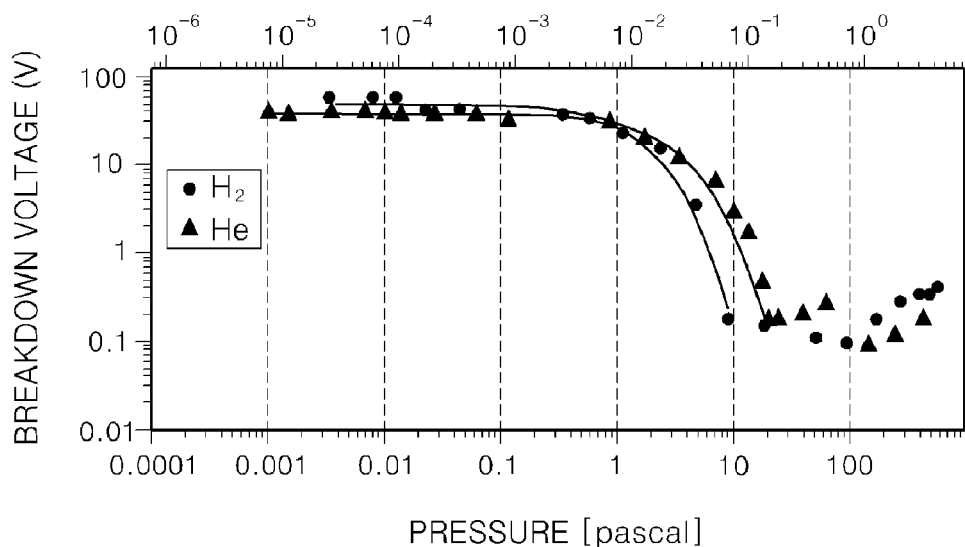
FIG. 5B is a graph showing breakdown voltages of $H_2$ and He according to pressure.

FIG. 5A is a graph showing a breakdown voltage of Ar according to pressure (extracted from 'Low-pressure Argon breakdown in combined dc and rf fields', M. Radmilovic-Radjenovic, J. K. Lee, Z. Lj. Petrovic, XXVIIth ICPIG, Eindhoven, the Netherlands, 18-22 Jul., 2005), and FIG. 5B is a graph showing breakdown voltages of $H_2$ and He according to pressure (extracted from 'RF Breakdown Studies at ORNL', John Caughman, A. V, W.B, D.S and D.R., Oak Ridge National Lab., ICRF Technology Workshop, 15th Topical Conference on Radio Frequency Power in Plasma, May 21, 2003).

First, in FIG. 5A, a full square represents experimental results and a blank square represents simulation results. A dotted line represents a theoretical prediction value. As seen from FIG. 5A, the breakdown voltage of Ar is 150-200 V at more than 1 torr.

Next, in FIG. 5B, a circle represents the breakdown voltage of $H_2$ and a triangle represents the breakdown voltage of He. As seen from FIG. 5B, the breakdown voltage of $H_2$ is around 0.2 V at more than 1 torr, and the breakdown voltage of He is around 0.1 V at more than 1 torr.

In the present invention, a gas having a low breakdown voltage such as He of FIG. 5B is added as a plasma reaction gas so that the stability of plasma can be improved. For example, Ar is used as a base gas for the plasma reaction gas, and He is added to Ar. When plasma is uniformly and stably generated, comparatively many nuclear creation sites are made at an initial stage of deposition so that the grain of the phase-change film can be prevented from being coarse and a grain size can be reduced. Crystallinity is degraded so that amorphousness can be performed entirely or locally. In addition, the phase-change film can be densely formed and a film having good surface roughness and uniformity can be formed. Thus, the crystallinity of the film can be adjusted and the grain size and morphology of the deposited film can be adjusted.

Figure 6A:
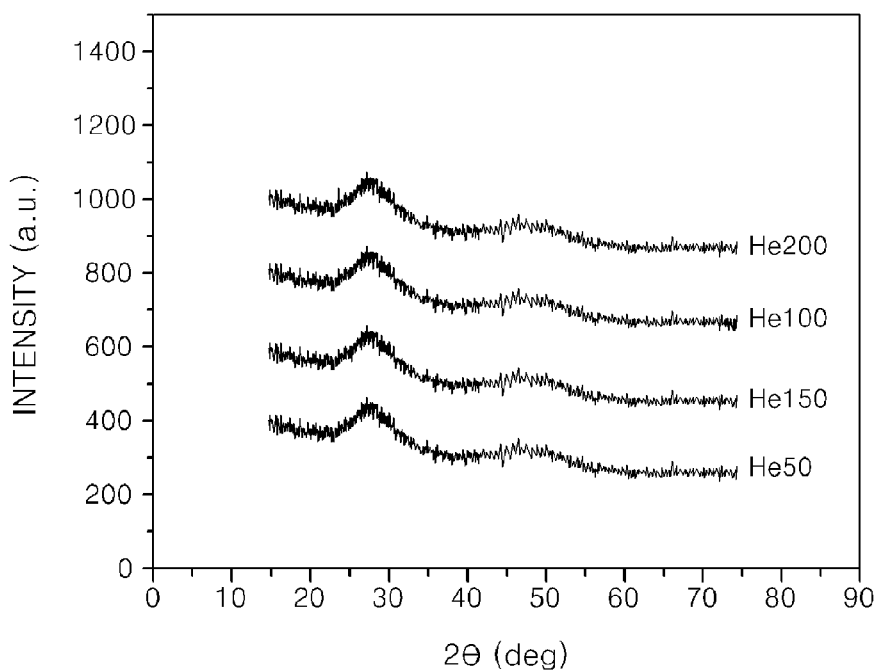
FIG. 6A shows the XRD results of a chalcogenide film due to addition of He using a plasma reaction gas.
Figure 6B:
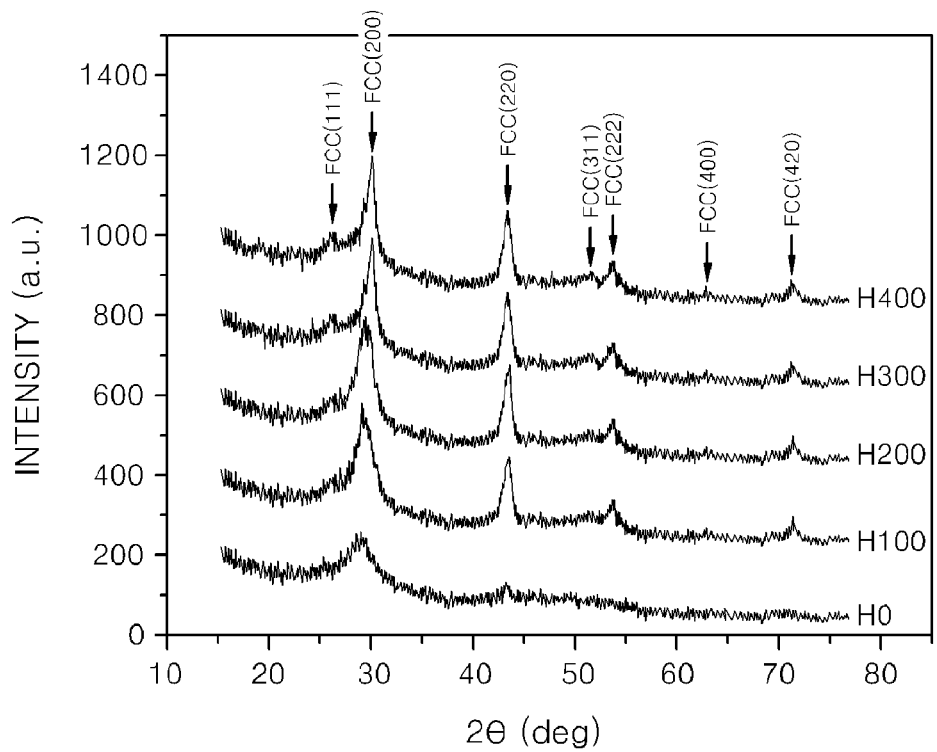
FIG. 6B shows the XRD results of a chalcogenide film due to addition of $H_2$ using a plasma reaction gas.

FIG. 6A shows the XRD results of a chalcogenide film due to addition of He using a plasma reaction gas, and FIG. 6B shows the XRD results of a chalcogenide film due to addition of $H_2$ using a plasma reaction gas.

Referring to FIG. 6A, XRD measurement is performed by sequentially increasing the amount of He by 50 sccm from 50 sccm to 200 sccm. A crystal peak is not shown. By using He like in the present invention, a deposited film can be locally or entirely formed to have an amorphous state. Thus, the crystallinity of the chalcogenide film can be adjusted by using the method according to the present invention.

As described above, when the crystallinity of the chalcogenide film is clear, the specific resistance of a film is low and larger power is required for phase change. However, according to the present invention, the chalcogenide film can be made in an amorphous state and the present invention is advantageous to low power. In contrast, referring to FIG. 6B, it will be understood from the intensity of an XRD peak that the crystallinity of the chalcogenide film is clear when H is added.

Figure 7:
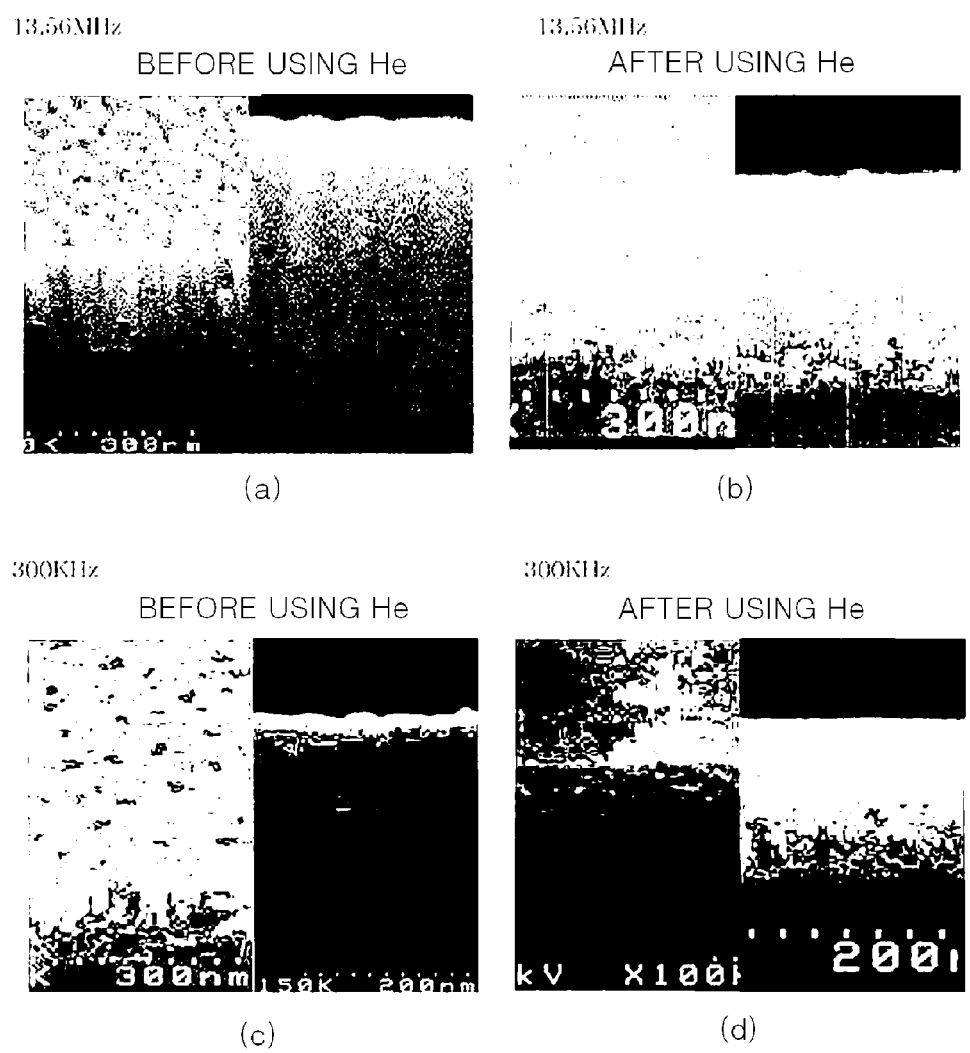
FIG. 7 shows morphology due to addition of He using a plasma reaction gas.

FIG. 7 shows morphology due to addition of He using a plasma reaction gas.

First, (a) of FIG. 7 is a scanning electron microscope (SEM) photo showing the surface and cross-section of the chalcogenide film before He is used when a plasma frequency is 27.12 MHz. In (a) of FIG. 7, a grain size is very large and surface morphology is not good. (b) of FIG. 7 is an SEM photo showing the surface and cross-section of the chalcogenide film after He is used when a plasma frequency is 27.12 MHz. In (b) of FIG. 7, a grain size is smaller than (a) and surface morphology is good. Even through simple comparison of (a) and (b) of FIG. 7, morphology is improved after He is used. In actuality, the thickness uniformity of (a) is 27% and the thickness uniformity of (b) is 7% so that thickness uniformity can be considerably improved after He is used.

Next, (c) of FIG. 7 is an SEM photo showing the surface and cross-section of the chalcogenide film before He is used when a plasma frequency is 300 KHz. In (c) of FIG. 7, a grain size is smaller than that of (a) of FIG. 7 but the grain size is still large and surface morphology is not good. (d) of FIG. 7 is an SEM photo showing the surface and cross-section of the chalcogenide film after He is used when a plasma frequency is 300 KHz. In (d) of FIG. 7, a grain size is small and surface morphology is good. Even through simple comparison of (c) and (d) of FIG. 7, morphology is improved after He is used. In actuality, the thickness uniformity of (c) is 9% and the thickness uniformity of (d) is 0.8% so that thickness uniformity can be considerably improved after He is used.

In sum, as illustrated in FIG. 7, a change in morphology due to addition of He when a plasma frequency is 300 KHz and 27.12 MHz, respectively, is clear, and a change in thickness uniformity is reduced by from 20-30% to less than 1%.

As a result of experiments carried out by the present inventors, in the chalcogenide film deposited using plasma having a frequency of 27.12 MHz, the content of impurity is less than 1% regardless of the amount of a reduction gas. However, by depositing the chalcogenide film by adding He to a reaction gas using the same method as in the present invention, the concentration of an impurity can be increased by several % according to the amount of He. In the present invention, the frequency bandwidth of plasma is 300 KHz to 27.12 MHz, preferably, 2 MHz to 27.12 MHz, and the amount of He is adjusted so that the concentration of the impurity included in the chalcogenide film can be adjusted by 1-10%. Here, the impurity may comprise a solid solution element that may exist in a source and a reaction gas which are materials of the deposited film, for example, C, N, P, B, and a combination thereof. The proper amount of He depends on a frequency region and may be 50-1000 sccm.

Low power of a phase-change memory using a chalcogenide phase-change film relates to the concentration of the solid solution impurity contained in a chalcogenide compound. Since the impurity causes stress in a lattice structure in a phase, an energy required for phase change when power required for driving is applied can be reduced.

In the present invention, plasma is stabilized by adding He which is a reaction gas having a low breakdown voltage so that the number of nuclear creation sites can be increased, and the decomposition degree of an MO source is adjusted and an impurity having the concentration of several % can remain in the chalcogenide film deposited even in a high frequency region.

In the prior art, the chalcogenide film is deposited using a frequency of more than 13.56 MHz. In the frequency, in contrast to the general characteristic of the phase-change memory in which the decomposition of the source is vivid and the decomposition temperature is low, since there is a temperature rise effect caused by collision with ions, electrons, and neutral particles generated in plasma, an impurity such as C that exist in the source is excessively reduced and is removed and the impurity does not easily exist in the film. Thus, an additional doping operation must be performed. However, according to the present invention, even when the frequency of 13.56 MHz is used, a reaction gas including He during deposition is used so that the impurity can be included in the chalcogenide film without an additional doping operation.

Consequently, in the present invention, when the phase-change film is deposited through a method using plasma such as PECVD, PEALD, RACVD or RAALD, the reaction gas including He is used such that the crystallinity of the chalcogenide film is adjusted, the grain size and morphology of the deposited film is adjusted and a film including the proper amount of an impurity is deposited without an additional doping process.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

As the device is highly integrated, the crystallinity and grain size of the phase-change film become important. By suppressing excessive crystal growth, the crystallinity of the phase-change film can be adjusted, the deposited film can be made to have an amorphous state and the present invention is advantageous to low power. In addition, a chalcogenide film can be densely formed and a film having good surface roughness and uniformity can be formed.

The invention claimed is:

1. A method of depositing a chalcogenide film for phase-change memory using plasma, wherein the chalcogenide film is deposited using a reaction gas including He as a plasma reaction gas thereby affecting the morphology of the chalcogenide film.

2. The method of claim 1, wherein a frequency bandwidth of the plasma is 300 KHz to 27.12 MHz.

3. The method of claim 1, wherein the chalcogenide film comprises at least one selected from the group consisting of GaSb, InSb, InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe) or $Te_{81}Ge_{15}Sb_2S_2$ and a combination thereof.

4. The method of claim 1, wherein a frequency bandwidth of the plasma is 2 MHz to 27.12 MHz, and the amount of He is adjusted such that a concentration of impurity included in the chalcogenide film is adjusted by 1-10%.

5. The method of claim 4, wherein the impurity comprises a solid solution element.

6. The method of claim 4, wherein the impurity comprises one selected from the group consisting of C, N, P, and B, and a combination thereof.

* * * * *